United States Patent [19]

Zuk et al.

[11] Patent Number: 4,636,719

[45] Date of Patent: Jan. 13, 1987

[54] APPARATUS FOR EXTENDED PRECISION PHASE MEASUREMENT

[75] Inventors: David M. Zuk, Ann Arbor; Vernon L. Larrowe, Ypsilanti, both of Mich.

[73] Assignee: Environmental Research Institute of Michigan, Ann Arbor, Mich.

[21] Appl. No.: 667,355

[22] Filed: Nov. 1, 1984

[51] Int. Cl.[4] ............................................. G01R 25/00
[52] U.S. Cl. ................................. 324/83 D; 324/79 R
[58] Field of Search ............... 324/83 D, 83 R, 79 R, 324/79 D, 78 D; 307/525, 526, 529, 514; 328/133, 134, 155; 364/481, 487; 343/394, 442, 12 R; 356/5; 375/10, 120

[56] References Cited

U.S. PATENT DOCUMENTS

3,600,090  8/1971  Wood et al. ............................ 356/5
4,569,078  2/1986  Zuk ........................................ 356/5

Primary Examiner—Michael J. Tokar
Attorney, Agent, or Firm—Krass & Young

[57] ABSTRACT

An apparatus for measuring the phase difference between two signals including a precision extender employing a frequency multiplier for each of the signals, apparatus for heterodyning each of the signals back to their original frequencies, and a phase detector for measuring the phase difference of the heterodyned signals.

7 Claims, 4 Drawing Figures

APPARATUS FOR EXTENDED PRECISION PHASE MEASUREMENT

FIELD OF THE INVENTION

This invention relates to image sensors used in image processing systems for measuring the distance between a target and a measuring point and more particularly to means for extending the precision of these measurements.

BACKGROUND OF THE INVENTION

Optical distance measuring equipment is well known and has enjoyed widespread use, particularly in the field of digital image processing. This equipment typically employs a light source for illuminating the target points of interest. The light source is modulated by a reference signal at a given frequency. Detector means are provided for receiving light reflected from the target and generating an information waveform in response thereto. The distance between the light source and the target is obtained by measuring the phase shift between the reference and information waveforms.

The Environmental Research Institute of Michigan, the assignee of the present invention, has developed an improved image sensor which employs the above-described technique to generate a multi-bit digital pixel value representative of various characteristics, such as the distance between the image sensor and the target. The image sensor includes phase detector circuitry employed to detect the phase difference between the reference and information waveforms. This phase detector employs comparator circuits for converting the reference and information waveforms into digital logic level signals and a multi-bit digital counter, driven at a selected clock frequency by a phase locked loop frequency multiplier. The counter is enabled to begin counting at the clock frequency upon receipt of an edge of one of the digital levels and is reset upon the occurrence of a corresponding edge of the other digital logic level signals. Storage means is also provided for storing the count on the counter output after the counter has stopped. This storage means thus provides a multi-bit digital pixel value representative of the phase difference between the signals.

Various means have been utilized in the past to increase the level of precision of phase measurement devices. U.S. Pat. No. 3,728,025, issued to Madigan et al, discloses optical distance measuring equipment which transmits and receives three signals of varying frequency. The signals are so spaced in frequency range that a digital processing circuit provides coarse, intermediate and fine distance measurements.

U.S. Pat. No. 4,297,030, issued to Chaborski, discloses that the precision of a phase detector employing a digital counter may be increased by frequency multiplying the signal that drives the counter.

Unfortunately, the level of precision for each of these devices is limited by the maximum counting rate of the high speed digital counters.

It is an object of the present invention to provide means for extending the precision of phase measurement devices.

SUMMARY OF THE INVENTION

According to the present invention, an apparatus for extended precision phase measurement employs means for frequency multiplying each of the reference and reflective wave signals, means for heterodyning each of the signals back to its original frequency, and phase detector means for measuring the phase difference of the heterodyned signals. In the preferred embodiment, one or more high speed digital counters are employed in a phase detector to generate a pixel value, having n binary digits (bits), representative of the measurable phase difference between the original reference and information waveforms. Each of the original waveforms is then frequency multiplied, heterodyned down to the original frequency and supplied as input to a second phase detector to obtain a second N bit pixel value. This n bit pixel value is representative of n additional bits of precision which may be added to the least significant end of the n bit pixel value obtained as output of the first phase detector.

The precision of the phase measurement may be extended N more bits by using the input signals to the second phase detector as input signals to enter a second precision extending stage identical to the one described above. Thus, the desired number of bits of precision may be obtained by routing output signals from each precision extending stage to the input of another identical stage in a cascaded fashion.

BRIEF DESCRIPTION OF THE DRAWINGS

These and other advantages of the present invention will become apparent to one skilled in the art upon reading the following specification and by references to the drawings in which.

DESCRIPTION OF THE PREFERRED EMBODIMENT

Figure 1:
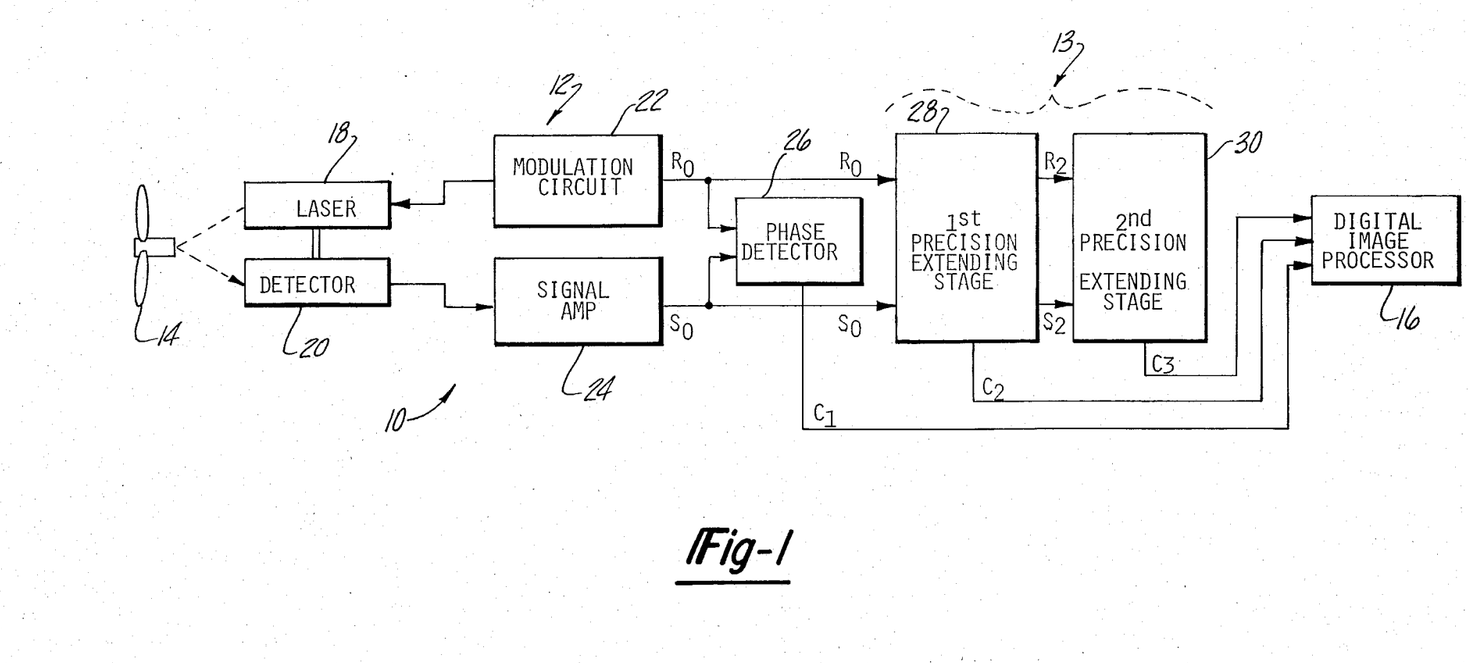
FIG. 1 is a block diagram of an image sensor utilized in connection with a digital image processing system which incorporates the preferred embodiment of the present invention.

Referring to FIG. 1, an image analyzer system 10 is shown, including an image sensor generally designated by the numeral 12 which incorporates the precision extending phase measurement system 13 of the present invention for generating multi-bit pixel values associated with the characteristics of a target 14 for analysis by the digital image processor 16. In the disclosed embodiment, the target 14 takes the form of a propellor. The image sensor is preferably of a type described in U.S. application Ser. No. 419,260, assigned to the assignee of the present invention. Similarly, the digital image processor utilized in the preferred embodiment is preferably of the type disclosed in U.S. Pat. Nos. 4,167,728; 4,174,514; 4,322,716; 4,395,699; and 4,414,685, all of which are assigned to the assignee of the present invention. However, it should be understood that the present invention is capable of extending the precision of many phase measurement devices utilizing high speed digital counters.

Image sensor 12 utilizes a light source 18 such as a helium-neon laser for illuminating portions of a target 14. A light detector 20 is physically coupled to laser 18.

This combination is scanned across the object 14 with the detector 20 providing an information waveform output as a function of a light reflected from the target. The detector 20 may take the form of any suitable transducer such as a photodiode.

A modulation circuit 22 is typically employed for modulating laser 18. The modulation circuit 22 preferably employs conventional "mode locking" techniques to amplitude modulate laser 18 using acousto-optical devices. The modulation circuit 22 also typically supplies a reference waveform at its output which is a function of the signal used to modulate the laser 18.

The output of the detector 20 is coupled to a signal amplifier 24 including conventional preamplifiers, filters and limiting amplifiers to shape the waveform generated by detector 20. The difference in phase between the reference and information waveforms is a function of the distance between the laser 18, the detector 20, and the scanned portion of the target 14. It can be appreciated that the further the distance the scanned object portion is away from the laser, the larger the phase difference between the reflected waveform and the reference waveform within a given ambiguity interval.

Phase detector 26, preferably of the type shown in FIG. 3 and hereinafter described in greater detail, receives the reference and information waveforms as inputs and outputs an N bit digital signal, $C_1$, representative of the phase difference between the reference and information waveforms. The modulation circuit 22 and signal amp 24 also output reference signal $R_0$ and information signal $S_0$ to a first precision extending stage 28. This precision extending stage outputs an n bit digital signal $C_2$ representing N additional bits of precision in the measurement of the phase difference between the original reference and information waveforms $R_0$ and $S_0$. The first precision extending stage 28 also outputs a reference waveform $R_2$ and information waveform $S_2$ to the next precision extending stage in the chain.

The next precision extending stage in the chain 30 outputs an additional n bit word $C_3$ representing n additional bits of precision in the measurement of the phase difference between the original reference and information waveforms. Thus, the outputs C1-C3 of the phase detector 26 and each of the precision extending stages 28,30 shown, may then be combined to generate a phase difference measurement having 3n bits of precision. It will be appreciated by those skilled in the art that additional identical precision extending stages may be added in a serial fashion to the chain 13 if more precision is required.

Figure 2:
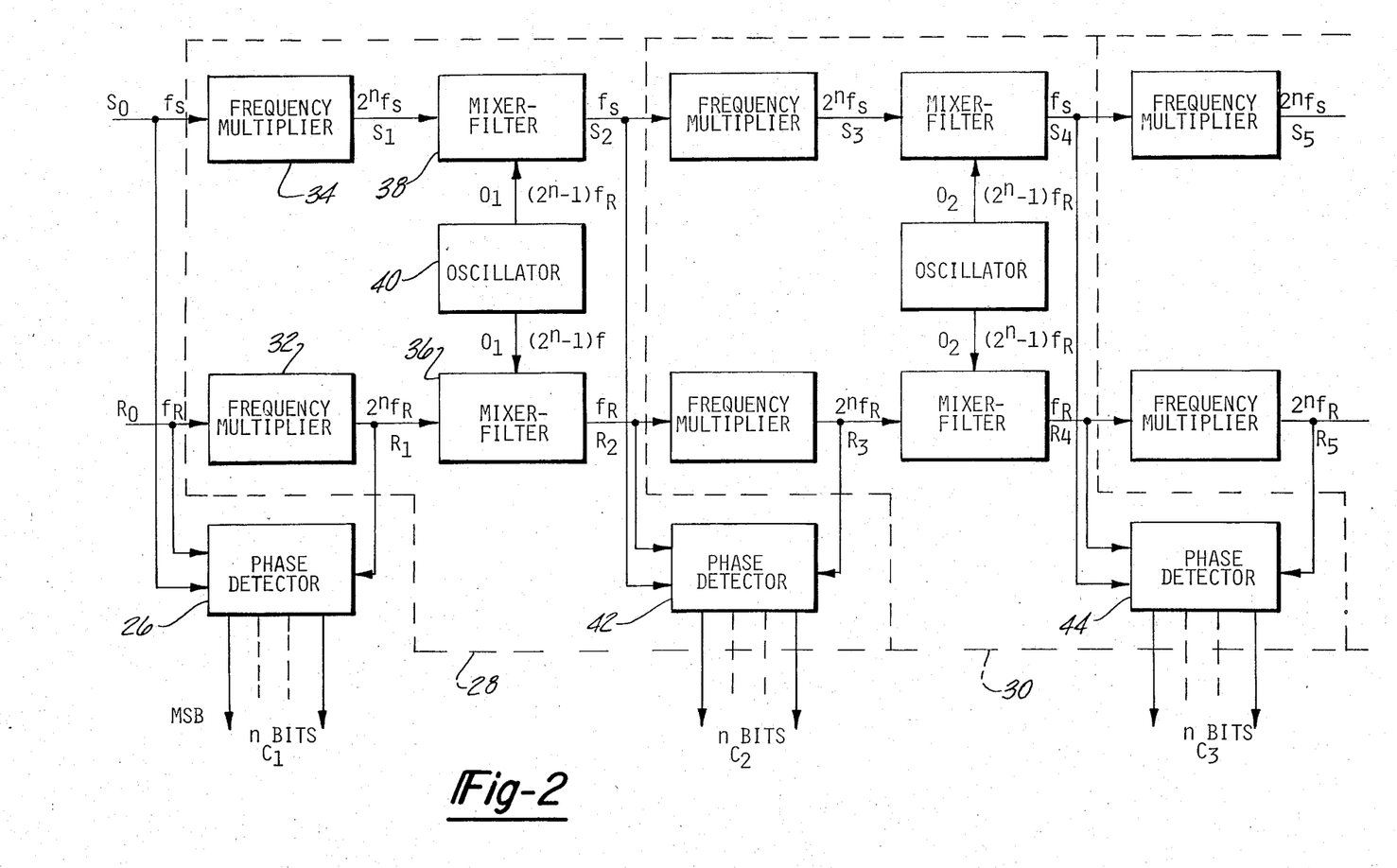
FIG. 2 is a block diagram of a precision extending phase measurement system employing the present invention.

Referring to FIG. 2, the extended precision phase measurement device of the preferred embodiment includes a first phase detector 26 and one or more precision extending stages 28-30, each stage adding n significant bits of precision to the phase difference measurement. The first phase detector 26 measures the phase difference between the reference signal $R_0$ and the information signal $S_0$ to some achievable precision of n bits. The output of the first phase detector 26 will be the n most significant bits of a binary word which represents the measured phase angle between the reference signal $R_0$ and the information signal $S_0$. The reference signal $R_0$ and information signal $S_0$ are fed into frequency multipliers 32 and 34 respectively. The frequency multipliers 32-34 preferably consist of n frequency doublers, so that each outputs a sinusoidal signal having $2^n$ times the frequency $f_r$ of the input signals $R_0$ and $S_0$. It should be noted that these frequency multipliers must be "truly multiplicative". That is, the multipliers must multiply the frequencies and phase difference of the signals. Thus, frequency multipliers that employ phase locked loops will not work in this application because the phase difference is not multiplied when the frequency of the signals is multiplied. It should also be noted that the output of the reference signal frequency multiplier 32 may be used as an input to the first phase detector 26 to drive the high speed counter in this phase detector.

Each of the frequency multipliers 32-34 outputs signals R1 and S1 respectively having a frequency and phase difference of $2^n$ times the frequency and phase difference of the input signals. It should be noted that the phase difference of the output signals is now an integral number of cycles of the frequency multiplied signal plus a residual phase difference. It will be shown that the integral cycle portion of the phase difference corresponds exactly to the portion of the phase difference represented by the value of the N bit word generated by the first phase detector 26.

The residual phase difference is next measured by first heterodyning the $2^n f_s$ and $2^n f_r$ output of the frequency multipliers 32-34 back to their original frequencies. This is done by inputting each of the frequency multiplied signals $R_1$ and $S_1$ through conventional mixer-filters 36-38. At this point the two signals $R_1$ and $S_1$ are each heterodyned back to the original frequency $f_r$ and $f_s$ of signals $R_0$ and $S_0$ respectively using the same local oscillator signal supplied from a conventional oscillator 40. In the preferred embodiment, the oscillator signal has a frequency of $(2^{n-1})f_r$. The output signals $R_2$ and $S_2$ of each of mixer-filters 36 and 38 respectively are then input to the second phase detector 42 for measuring the phase difference between the resulting frequency translated signals. The n bit word $C_2$ output by the second phase detector 42 represents a measurement of the residual phase difference between the two frequency multiplied signals $R_1$ and $S_1$. It will be shown that the output of the second phase detector 42 corresponds to n bits of lesser significance of phase measurement of the phase difference between the original signals, so that the outputs $C_1$ and $C_2$ from the first and second phase detectors 26 and 42 may be combined to form a digital word of length 2n which represents the phase difference between the original reference and information signals $R_0$ and $S_0$. The heterodyned signals $R_2$ and $S_2$ may then be supplied as inputs to another precision extending stage 30 where n additional bits of precision are obtained as the output from the third phase detector 44.

Additional stages can be added to the system in order to extend the precision of phase measurement by the desired number of bits.

Figure 3:
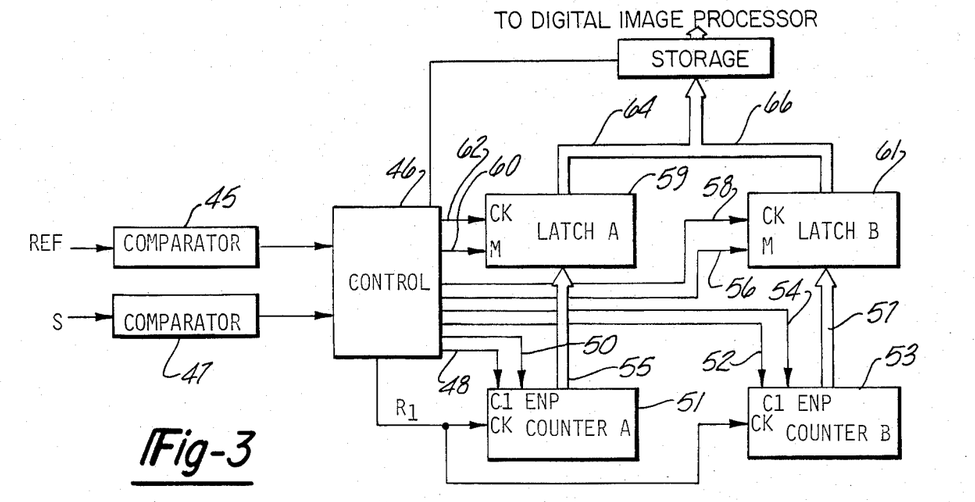
FIG. 3 is a block diagram of the phase detector utilized in the preferred embodiment of the present invention.

It should be noted that the phase detectors 26, 42 and 44 utilized in the preferred embodiment are identical and are preferably of the type shown in detail in FIG. 3. A pair of comparators 45 and 47 are utilized to convert the reference and information signal waveform into digital logic levels, respectively. In this embodiment comparators 45 and 47 take the form of standard components such as National Semiconductor LM361 devices. In the preferred embodiment, the frequency multiplied signal of the next adjoining precision extending stage may be utilized to drive the high speed counters in the phase detector of the previous stage. For example, the frequency multiplied signal $R_1$ output from the frequency multiplier 32 in the first precision extending stage 28 may be utilized to provide clock pulses to a pair of high speed counters 51 and 53 in the first phase detector 26 in the chain. Counters 51 and 53 each provide up to eight bit output on lines 55 and 57, respectively, and may comprise standard 73S163 Texas Instrument counters. It should be noted that, in order to obtain n bits of output on lines 55 and 57, respectively, the frequency of the drive signal $R_1$ must be $2^n$ times the frequency of the input signals $R_0$ and $S_0$.

The outputs of counters 51 and 53 are coupled to multi-bit latches 59 and 61, respectively. The outputs of latches 59 and 61 are alternately coupled to a data storage device (not shown) to provide the pixel values generated by the image sensor to a digital image processor for analysis.

Figure 4:
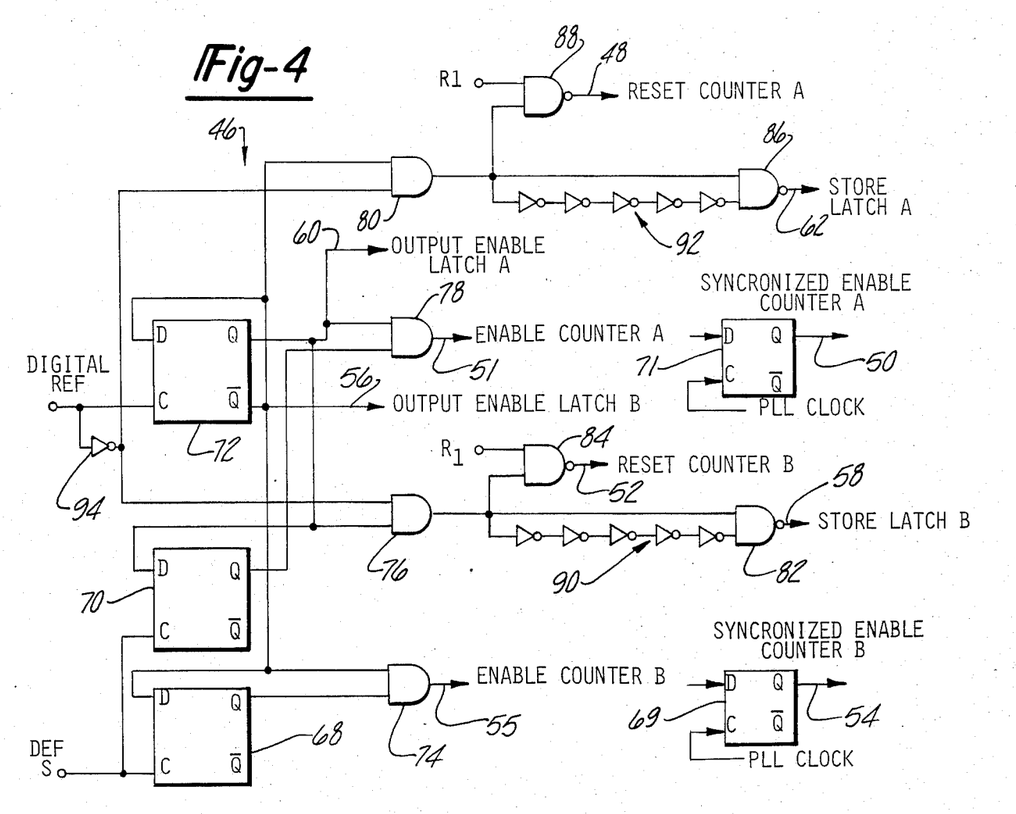
FIG. 4 is a schematic of the control circuitry utilized in the phase detectors.

Control circuitry 46 is responsible for enabling and resetting counters 51 and 53, as well as the transfer of data from the counters to their respective latches and, then, to the image processor. Control circuitry 46 provides appropriate signal levels on lines 48 and 50 to reset and enable counter 51. Similarly, signals on lines 52 and 54 serve to reset and enable counter 53. Signals on lines 56 and 58 serve as output enable signals and store signals for latch 61 as do signals on line 60 and 62 for latch 59. The store signals on lines 58 and 62 serve as clocks to cause the latches to store the current contents of their respective counter outputs when the store signal is received. Output enable signals on lines 56 and 60 operate to cause the latches to alternately couple the eight bit values stored therein to the image processor over lines 64 and 66. Control 46 may take a variety of forms to perform the functions as will be more fully explained below. FIG. 4 shows an example of a suitable circuit for accomplishing these functions. The control circuit 46 of FIG. 4 employs a group of D-type flip-flops 68-72 such as SN74S74 devices, AND gates 74-80, NAND gates 82-88, a series of pulse forming inverter networks 90-92; and suitable means such as inverter 94 provide a logical inversion of the digital reference logic level.

MATHEMATICAL DESCRIPTION OF SYSTEM

In the following, it is assumed that the input signal, $S_0$, has been amplified, limited, and filtered, so that it is free of noise. Similarly, the reference signal, $R_0$, is also of constant amplitude and noise free.

Assuming that the reference signal, $R_o$, at the left side of FIG. 2 is sinusoidal, with amplitude, $A_r$, and frequency, $f_r$, it may be described mathematically as $$R_o = A_r \cos(2\pi f_r t) \tag{2}$$

where t represents time, and t=0 is chosen so that $R_o$ is a maximum at that instant. In a range-measuring sensor, the signal, $S_o$, will have the same frequency as $R_o$, but will have a different phase and possibly a different amplitude. Thus:

$$S_o = A_s \cos(2\pi f_r t - \phi) \tag{3}$$

where
$\phi$ is the phase difference between $R_o$ and $S_o$

Each $2^n$ frequency multiplier in FIG. 2 is preferably made up of n cascaded frequency doublers. A frequency doubler operates by (1) squaring its input signal, (2) removing the dc component from the squaring circuit output, and (3) amplifying the resulting ac signal to given it an amplitude equal to that of the input signal. For example, squaring both sides of (3) gives $$S_o^2 = (A_s)^2 \cos^2(2\pi f_r t - \phi) \tag{4}$$

Using the trigonometric identity, $\cos^2 \alpha = \frac{1}{2} + \frac{1}{2} \cos 2\alpha$, we may rewrite (4) as $$S_o^2 = (A_s)^2 [\frac{1}{2} + \frac{1}{2} \cos(4\pi f_r t - 2\phi)] \tag{5}$$

or $$S_o^2 = \frac{1}{2}(A_s)^2 + \frac{1}{2}(A_s)^2 \cos(4\pi f_r t - 2\phi) \tag{6}$$

Subtracting $\frac{1}{2}(A_s)^2$ from both sides of (6) and multiplying both sides of the resulting equation by $2/A_s$ gives $$2/A_s[S_o^2 - \frac{1}{2}(A_s)^2] = A_s \cos(4\pi f_r t - 2\phi) \tag{7}$$

If the analog circuitry in the frequency doubler performs the operations on the signal $S_o$ indicated by the left side of Equation (7), the output will be a sinusoid having the same amplitude as $S_o$, twice the frequency, and twice the phase shift. If the signal, $S_o$, is passed through n cascaded frequency doublers, the output of the last doubler will have the form $$S_1 = A_s \cos(2^n \cdot 2\pi f_r t - 2^n \phi) \tag{8}$$

Note that not only the frequency, but also the phase angle has been multiplied by $2^n$.

Passing the reference signal, $R_o$, through n frequency doublers will produce a signal of the form:

$$R_1 = A_r \cos(2^n \cdot 2\pi f_r t) \tag{9}$$

since the phase angle is 0. Thus, the phase difference between (8) and (9) is $2^n$ times the original phase difference between $S_o$ and $R_o$.

Now, if the two frequency-multiplied signals, $S_1$, and $R_1$, are each heterodyned back to frequency, $f_r$, using the same local oscillator signal for each operation, the phase difference, $2^n \phi$, between the two resulting signals will be preserved. This is independent of the phase of the oscillator signal. Thus, if the local oscillator signal (oscillator 40 in FIG. 2) is $$O_1 = A_o \cos[(2^n - 1)2\pi f_r t + \theta] \tag{10}$$

then, using the trigonometric identify
$\cos \alpha \cos \beta = \frac{1}{2} \cos(\alpha - \beta) + \frac{1}{2} \cos(\alpha + \beta)$ (11)
the product of $S_1$, and $O_1$ as produced by the Mixer 38 in FIG. 2 is $$A_s A_o \{\frac{1}{2} \cos(2\pi f_r t - 2^n \phi - \theta) + \frac{1}{2} \cos [(2^{n+1} - 1)2\pi f_r t - 2^n \phi + \theta]\} \tag{12}$$

If (12) is passed through a bandpass filter, tuned to $f_r$, the higher frequency term will be eliminated; and if the gain of the filter is adjusted to $2/A_o$, the output of the filter will be $$S_2 = A_s \cos(2\pi f_r t - 2^n \phi - \theta). \tag{13}$$

Similarly, the output of mixer 36 is the product of $R_1$ and $O_1$, and using identity (11) this may be written $$A_r A_o \{\frac{1}{2} \cos(2\pi f_r t - \theta) + \frac{1}{2} \cos[(2^{3+1} - 1)2\pi f_r t + \theta]\} \tag{14}$$

The filter in the Mixer Filter 36 eliminates the higher-frequency term in (14) and multiplies the filtered low-frequency term by $2/A_o$ to give $$R_2 = A_r \cos(2\pi f_r t - \theta) \quad (15)$$

at the filter output. Comparison of (13) and (15) shows that the phase difference of $2^n\phi$ which existed between signals $S_1$ and $R_1$ still exists between $S_2$ and $R_2$. Thus, signals $S_2$, $R_2$, $S_o$, and $R_o$ all have the same frequency but the phase difference between $S_2$ and $R_2$ is $2^n$ times the phase difference between $S_o$ and $R_o$. Similarly if the frequency multiplication and translation operations are performed on $S_2$ and $R_2$ to give $S_4$ and $R_4$, the phase difference between $S_4$ and $R_4$ will be $2^n$ times that between $S_2$ and $R_2$. In summary, if $\phi_o$ is the phase difference between $R_o$ and $S_o$, then $$\phi_2 = 2^n \phi_o \quad (16)$$

and $$\phi_4 = 2^n \phi_2 \quad (17)$$

where $\phi_2$ is the phase difference between $R_2$ and $S_2$
and
$\phi_4$ is the phase difference between $R_4$ and $S_4$.

Phase Detector 26 contains a counter which counts the cycles of $R_1$, whose frequency is $2^n f_r$, which occur between a zero crossing of $R_o$ and the next corresponding zero crossing of $S_o$ for each cycle of $R_o$. The count so obtained corresponds to the phase difference between $R_o$ and $S_o$. If we designate this count as $C_1$, then $$\phi_o = \left( \frac{C_1}{2^n} \cdot 2\pi + \alpha_1 \right) \text{ radians} \quad (18)$$

The action of the frequency multiplier and counter is to divide each period of $R_o$ into $2^n$ intervals and to count the integral number of these intervals which fit into the time interval between corresponding zero crossing of the waveforms of $R_o$ and $S_o$. Then $C_1/2^n \cdot 2\pi$ is the measured phase angle in terms of the count, $C_1$, and $\alpha_1$ is the remaining portion of $\phi_o$. Mathematically, $$\alpha_1 = \phi_o \text{ modulo } 2\pi/2^n \quad (19)$$

which means that $\alpha_1$ is the remainder after an integral division of $\phi_o$ by $2\pi/2^n$.

Phase Detector 42 measures the phase angle, $\phi_2$, between $R_2$ and $S_2$. Substituting (18) into (16) gives $$\phi_2 = 2^n \left( \frac{C_1}{2^n} \cdot 2\pi + \alpha_1 \right) = C_1 \cdot 2\pi + 2^n \alpha_1 \quad (20)$$

The $C_1 \cdot 2\pi$ term in (20) represents an integral number of cycles of phase shift, and thus will not affect the operation of the phase detector (No. 2) which measures $\phi_2$. The phase detector actually measures $$\phi_2 \text{ modulo } 2\pi = 2^n \alpha_1 \quad (21)$$

Since, from (19)

$$\alpha_1 < 2\pi/2^n \quad (22)$$

it follows that $$2^n \alpha_1 < 2\pi \quad (23)$$

If $C_2$ is the phase difference count obtained from Phase Detector 42, then we may write $$2^n \alpha_1 = \left( \frac{C_2}{2^n} \cdot 2\pi + \alpha_2 \right) \quad (24)$$

where $\alpha_2$ is the remaining portion of $2^n \alpha_1$ after $C_2$ increments of $2\pi/2^n$ radian have been counted.

Thus $$\alpha_2 = 2^n \alpha_1 \text{ modulo } \frac{2\pi}{2^n} \quad (25)$$

Phase Detector 44 measures (modulo $2\pi$) $\phi_4$, the phase angle between $R_4$ and $S_4$. Substituting (20) into (17), and then substituting (24) into the result gives:

$$\phi_4 = 2^n \phi_2 = 2^n C_1 \cdot 2\pi + 2^n (2^n \alpha_1) \quad (26)$$

$$= 2^n C_1 \cdot 2\pi + C_2 \cdot 2\pi + 2^n \alpha_2$$

$$\phi_4 \text{ modulo } 2\pi = 2^n \alpha_2$$

If the phase difference count between $R_4$ and $S_4$ is $C_3$, then we may write $$2^n \alpha_2 = \left( \frac{C_3}{2^n} \cdot 2\pi + \alpha_3 \right) \quad (27)$$

where $\alpha_3$ is the remaining porton of $2^n \alpha_2$ after $C_3$ increments of $2\pi/2^n$ radian have been counted Thus $$\alpha_3 = 2^n \alpha_2 \text{ modulo } \frac{2\pi}{2^n} \quad (28)$$

substituting (27) into (26) gives $$\phi_4 = 2^n C_1 \cdot 2\pi + C_2 \cdot 2\pi + 2^n \alpha_2 \quad (29)$$

$$= 2^n C_1 \cdot 2\pi + C_2 \cdot 2\pi + \frac{C_3}{2^n} \cdot 2\pi + \alpha_3$$

From (16) and (17)

$$\phi_o = \frac{\phi_4}{(2^n)^2} \quad (30)$$

Substituting (29) into (30) gives $$\phi_o = \frac{C_1}{2^n} \cdot 2\pi + \frac{C_2}{(2^n)^2} \cdot 2\pi + \frac{C_3}{(2^n)^3} \cdot 2\pi + \frac{\alpha_3}{(2^n)^2} \quad (31)$$

$$= 2\pi \left( \frac{C_1}{2^n} + \frac{C_2}{(2^n)^2} + \frac{C_3}{(2^n)^3} \right) + \frac{\alpha_3}{(2^n)^2}$$

From (28)

$$\alpha_3 < \frac{2\pi}{2^n}.$$

So, the last term in 31

$$\frac{\alpha_3}{(2^n)^2} < \frac{2\pi}{(2^n)^3} \qquad (32)$$

Then $$\phi_0 = 2\pi \left( \frac{C_1}{2^n} + \frac{C_2}{(2^n)^2} + \frac{C_3}{(2^n)^3} + \epsilon \right)$$

Where $$\epsilon < \frac{1}{(2^n)^3}$$

Since $C_1$, $C_2$, and $C_3$ each are integers with values from 0 to $2^n - 1$ the sequence $$C_1 C_2 C_3$$

represents a fraction written in base $2^n$ and having a value of $$C_1 \times (2^n)^{-1} + C_2 \times (2^n)^{-2} + C_3 \times (2^n)^{-3}$$

This is the same as the expression in parenthesis in Equation 31, so $$\theta_0 = (\cdot C_1 C_2 C_3 + \epsilon) 2\pi \qquad (33)$$

And thus the n bits representing $C_1$, the n bits representing $C_2$, and the n bits representing $C_3$ may be lined up in order to give a 3n bit word which represents $\theta_0/2\pi$. The error, $\epsilon$, is less than the interval represented by a change in the least significant bit.

Those skilled in the art will now appreciate that the precision extended phase measurement system of the present invention provides decided advantages over those approaches used in the past. In particular, by constructing the precision extending system as a series of identical stages, the output of each additional stage being n additional bits of precision, each of the individual stages may be constructed of relatively inexpensive off-the-shelf parts. It should be noted that the magnitude of frequency multiplication and, thus, the number of additional bits of precision gained at each individual stage is determined solely by the cost and availability of the individual components of the stage. For example, if a total of 3n bits of precision is desired and n bits of precision is obtained by the first phase detector 26 in the system, frequency multipliers 32 and 34 may be provided which multiply the frequencies of the input signals $R_0$ and $S_0$ by a magnitude of 2(2n). Assuming that the high speed digital counter in the second phase detector 42 is capable of being driven at a rate of $2(2n)f_r$, the desired precision may be obtained in one precision extending stage. However, in order to take advantage of the low cost of readily available parts, each of the frequency multipliers 32 and 34 in the preferred embodiment employs three cascaded frequency doublers, so that three additional bits of precision are added at each stage of the system.

We claim:

1. In an apparatus for measuring the phase difference between a first and second signal, the improvement comprising:
    means for increasing the precision of measurement of the phase difference between the signals including
    first phase detector means for measuring the phase difference between the signals to a precision of n bits,
    first and second frequency multiplier means for multiplying the frequency and phase of the first and second signals respectively by a factor of $2^m$ to form third and fourth signals respectively,
    first and second heterodyning means for heterodyning each of the third and fourth signals to produce fifth and sixth signals, the fifth and sixth signals each having a frequency equal to the first and second signals, and
    second phase detector means for measuring the phase difference between the fifth and sixth signals to a precision of m bits,
    whereby the m bit value obtained from the second phase detector means contributes m bits of additional accuracy to the n bit value obtained from the first phase detector means, thereby yielding a phase difference measurement with n+m bits of accuracy.

2. The apparatus of claim 1 wherein the second phase detector means includes:
    first and second comparator means for converting said first and second signals into digital logic level signals;
    a multi-bit digital counter having a clock input, an enable input, a reset input and an multi-bit output;
    clock means connected to the clock input of the counter for driving the same at multiples of the frequency of the first signal;
    control means coupled between the comparator means and the counter, operative to enable the counter to begin counting at the clock frequency upon receipt of an edge of one of the digital logic level signals and to reset the counter upon receipt of an edge of one of the digital logic level signals and to reset the counter upon receipt of a corresponding edge of the other digital logic level signal; and
    storage means coupled to the counter output and to the control means, operative to receive control signals from the control means and to store the generated count from the counter, whereby the storage means provides a multi-bit digital pixel value representative of the phase difference between the signals.

3. The apparatus of claim 1 wherein "n" and "m" each equals 3.

4. The apparatus of claim 1 wherein the first and second heterodyning means are mixer-filters.

5. The apparatus of claim 1 wherein the frequency multiplier means is m cascaded frequency doublers.

6. The apparatus of claim 1 wherein each of the first and second heterodyning means are driven by a local oscillator signal.

7. In an apparatus for measuring the phase difference between first and second input signals, the improvement comprising one or more cascaded precision extending stages, each stage including
    means for multiplying the frequency of each of two input signals from the preceding stage in a manner such that the phase difference between those input signals is also multiplied, means for heterodyning each of the frequency multiplied signals back to the frequency of the input signals, means for detecting the phase difference between the heterodyned signals and producing a multi-bit digital pixel value representative of the phase difference, and storage means for storing the multi-bit digital pixel, whereby the multi-bit digital pixel stored in each stage is representative of n bits of greater precision in the measurement of the phase difference between the input signals than the multi-bit digital pixel from the previous stage.

* * * * *

UNITED STATES PATENT AND TRADEMARK OFFICE
CERTIFICATE OF CORRECTION

PATENT NO. : 4,636,719

DATED : January 13, 1987

INVENTOR(S) : David M. Zuk et al

It is certified that error appears in the above-identified patent and that said Letters Patent is hereby corrected as shown below:

Column 2, line 12, "N" should be --n--.

Column 3, line 33, "N" should be --n--.

Signed and Sealed this

Twenty-eighth Day of April, 1987

Attest:

DONALD J. QUIGG

Attesting Officer

Commissioner of Patents and Trademarks